US007276972B2

(12) United States Patent
Kosugi et al.

(10) Patent No.: US 7,276,972 B2
(45) Date of Patent: Oct. 2, 2007

(54) DISTRIBUTED AMPLIFIER

(75) Inventors: Makoto Kosugi, Tokyo (JP); Akira Nishino, Tokyo (JP); Yasunori Ogawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 244 days.

(21) Appl. No.: 11/060,299

(22) Filed: Feb. 18, 2005

(65) Prior Publication Data

US 2005/0285680 A1 Dec. 29, 2005

(30) Foreign Application Priority Data

Jun. 25, 2004 (JP) ............................. 2004-188144

(51) Int. Cl.
*H03F 3/60* (2006.01)

(52) U.S. Cl. ....................................... 330/286; 330/295

(58) Field of Classification Search ............ 330/53–57, 330/84, 286, 295

See application file for complete search history.

(56) References Cited

U.S. PATENT DOCUMENTS 4,456,888 A * 6/1984 Ayasli ........................ 330/286

FOREIGN PATENT DOCUMENTS

JP 07-183428 7/1995
JP 2003-152476 5/2003

* cited by examiner

*Primary Examiner*—Khanh Van Nguyen
(74) *Attorney, Agent, or Firm*—Rabin & Berdo, P.C.

(57) ABSTRACT

A distributed amplifier with a simple structure that permits miniaturization of circuit in which the input-side transmission line of the distributed amplifier is constituted by a coplanar line having a signal line and a ground face formed on the upper face of a dielectric substrate and the output-side transmission line of the distributed amplifier is constituted by a microstrip line having a signal line formed on the upper face of the dielectric substrate and a ground face formed on the lower face of the dielectric substrate. In addition, a plurality of amplification transistors is formed on the upper face of the dielectric substrate and each of the electrodes is connected to the signal line or the ground face that is formed on the upper face of the dielectric substrate. Because a large transistor-drive current does not flow to the input-side transmission line, the signal line can be made narrow and there is no increase in the required surface area even in the case of a coplanar line. Further, because the ground face of the coplanar line can be formed on the upper face of the dielectric substrate, the source electrodes or similar of the transistors can be grounded easily with a simple structure.

4 Claims, 3 Drawing Sheets

20: OUTPUT-SIDE TRANSMISSION LINE
VDD
21 22 23 24 25 26 27 9
5 41 42 43 44 45 46 6
31 32 33 34 35 36 40: TRANSMISSION LINE
GND
1
11 12 13 14 15 16 17 3
10: INPUT-SIDE TRANSMISSION LINE
GND

VI G2 w1 S1 G2 w2 w3 S2 VI
t2 t1 SUB G2
G1

DISTRIBUTED AMPLIFIER

BACKGROUND OF THE INVENTION

1. Field of the Invention

The present invention relates to a distributed amplifier having a broadband characteristic that is employed in an optical communication system, for example.

2. Description of the Related Art

The prior art includes Japanese Patent Kokai No. H7-183428 (Patent Document 1) and Japanese Patent Kokai No. 2003-152476 (Patent Document 2).

FIG. 1 is a constitutional view of a conventional distributed amplifier.

As per the circuit constitution shown in FIG. 1, this distributed amplifier comprises an input-side transmission line 2 connected to an input terminal 1 that is supplied with input signals over a wide range. The input-side transmission line 2 serially connects seven line elements 2*a*, 2*b*, . . . , 2*g*, for example. The leading terminal of line element 2*a* is connected to input terminal 1 and the end terminal of line element 2*g* is connected to the ground potential GND via a terminator 3.

This distributed amplifier also comprises an output-side transmission line 4 that corresponds with the input-side transmission line 2. The output-side transmission line 4 serially connects seven line elements 4*a*, 4*b*, . . . , 4*g*. The leading terminal of the line element 4*a* is connected to the ground potential GND via a terminator 5 and the end terminal of the line element 4*g* is connected to an output terminal 6.

Six transistors 7*a*, 7*b*, . . . , 7*f*, which are amplification units, are also connected in the form of a distribution circuit via six transistors 7*a*, 7*b*, . . . , 7*f* constituting amplification units and a transmission line 8 between the input-side transmission line 2 and the output-side transmission line 4. That is, the gate electrode of the transistor 7*a* is connected to the connection point of the line elements 2*a* and 2*b* and the drain electrode of the transistor 7*a* is connected to the connection point of the line elements 4*a* and 4*b* via the line element 8*a* of the transmission line 8. Likewise, hereinafter, the gate electrode of the transistor 7*f* is connected to the connection point of the final line elements 2*f* and 2*g* and the drain electrode of the transistor 7*f* is connected to the connection point of the line elements 4*f* and 4*g* via the line element 8*f*. The source electrodes of the transistors 7*a* to 7*f* are connected to the ground potential GND. Further, a supply voltage VDD is supplied to the output terminal 6 via an inductor 9.

Representative forms that constitute the input-side transmission line 2, output-side transmission line 4 and amplification-unit transmission line 8 include the microstrip line and coplanar line.

As shown in FIG. 2, the microstrip line is constituted such that the whole of the rear face of the dielectric substrate SUB1 is the ground face G1 and the signal line S1 is disposed on the upper surface of the dielectric substrate SUB1. Supposing that the width of the signal line S1 is w1 and the thickness of the dielectric substrate SUB1 is t, the characteristic impedance Z0 of the microstrip line can be expressed as $Z0=A\times t/w1$ (where A is the proportionality constant).

Meanwhile, as shown in FIG. 3, the coplanar line has a signal line S2 disposed on the upper surface of a dielectric substrate SUB2 and there is a ground face G2 on both sides of the signal line S2. Supposing that the width of the signal line S2 is w2 and the interval between the signal line S2 and ground faces G2 is w3, the characteristic impedance Z0 of the coplanar line can be expressed as $Z0=B\times w3/w2$ (where B is the proportionality constant).

The distributed amplifier is normally designed with an I/O impedance of 50Ω. For this reason, the characteristic impedance Z0 of the input-side transmission line 2 or the like must be set as 70 to 90Ω in consideration of the static capacitance of the transistors 7*a* to 7*f* of the amplification unit.

However, the distributed amplifier is subject to the following problems.

(1) When the input-side transmission line 2 and output-side transmission line 4 are both constituted by a microstrip line, the signal line and ground face are on different faces with a dielectric substrate interposed therebetween. Therefore, viaholes must be provided in the dielectric substrate in order to reach ground via the shortest route as per the source electrodes of the transistors 7*a* to 9*f* in FIG. 1, which makes the wiring process complicated.

(2) When the input-side transmission line 2 and output-side transmission line 4 are both constituted by a coplanar line, the width w2 and internal w3 must both be wide in order to provide characteristic impedance Z0 of 70 to 90Ω and to secure the current capacitance flowing to the transistors 7*a* to 9*f*.

For example, when a microstrip line with a signal line width of 50 μm is created by using a GaAs substrate that is 220 μm thick, the characteristic impedance is then 77Ω. In contrast, in order to create a coplanar line with the same signal line width and characteristic impedance by means of the same GaAs substrate, the interval between the signal line and ground faces must be 140 μm. Therefore, miniaturization of the circuit is problematic.

(3) As disclosed in Patent Document 1, when a microstrip line and a coplanar line are mixed and the signal lines of the microstrip line and coplanar line respectively are arranged on different faces, the structure is a complex one.

SUMMARY OF THE INVENTION

An object of the present invention is to provide a distributed amplifier with a simple structure that permits miniaturization.

The distributed amplifier of the present invention uses a coplanar line and a microstrip line as transmission lines. The signal line and ground faces of the coplanar line, the signal line of the microstrip line, and a plurality of amplification transistors are formed on the upper face of the dielectric substrate and the ground faces of the microstrip line are formed on the lower face of the dielectric substrate.

According to the present invention, the signal line and ground faces of the coplanar line, the signal line of the microstrip line, and the amplification transistors are formed on the upper face of the dielectric substrate. Therefore, all of the respective electrodes of the transistors can be connected to the signal lines and ground faces, and so forth, on the upper face of the dielectric substrate. Accordingly, viaholes need not be provided in the dielectric substrate in order to connect the transistors. As a result, a distributed amplifier with a simple structure that permits circuit miniaturization is obtained, and so forth.

The input-side transmission line of the distributed amplifier is constituted by a coplanar line having a signal line and ground faces formed on the upper face of a dielectric substrate and the output-side transmission line is constituted by a microstrip line having a signal line formed on the upper face of the dielectric substrate and ground faces formed on the lower face of the dielectric substrate. In addition, a plurality of amplification transistors is formed on the upper face of the dielectric substrate and the respective electrodes of the transistors are connected to the signal line or ground faces thus formed on the upper face of the dielectric substrate.

Further objects and new characteristics of the invention will surely become more completely clear upon reading the following description of the preferred embodiments in conjunction with the attached drawings. However, the drawings merely permit an understanding of the invention and do not limit the scope thereof.

DETAILED DESCRIPTION OF THE INVENTION

Figure 1:
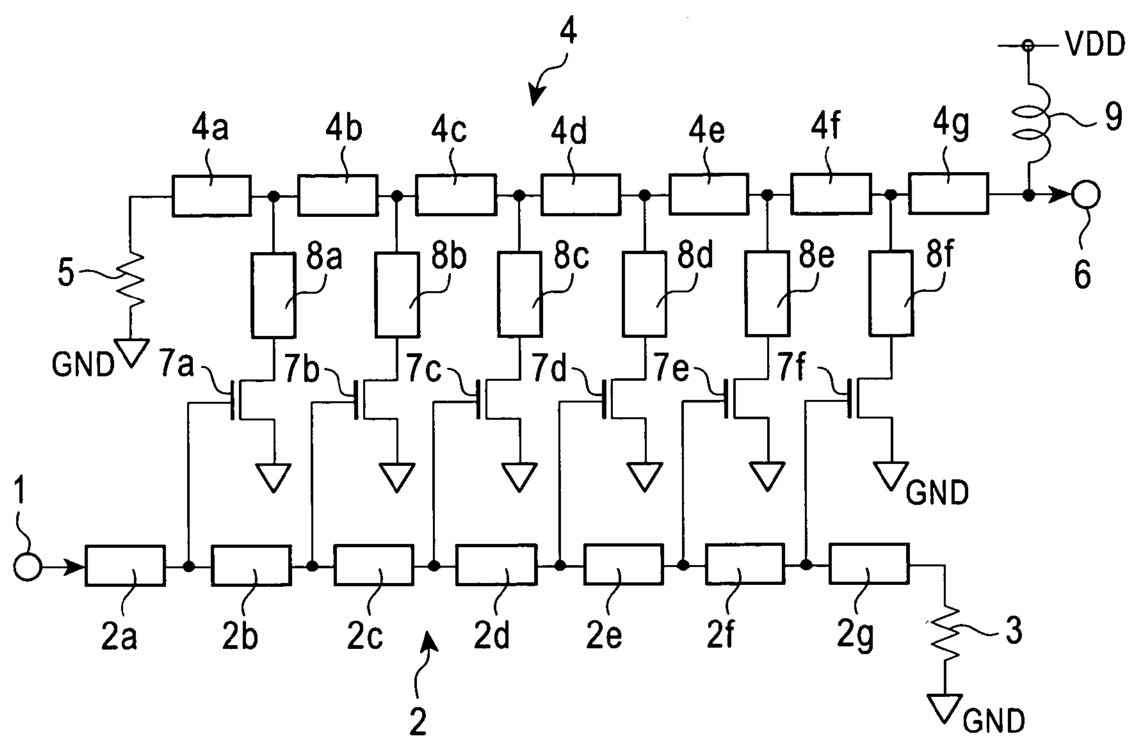
FIG. 1 is a constitutional view of a conventional distributed amplifier.
Figure 2:
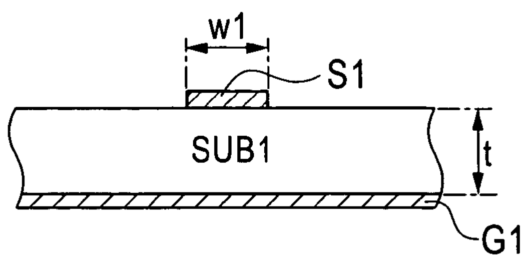
FIG. 2 shows the microstrip line of the circuit shown in FIG. 1.
Figure 3:
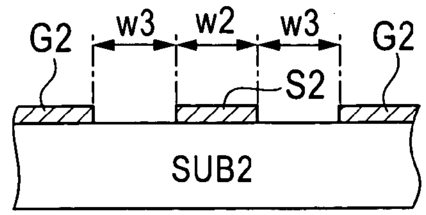
FIG. 3 shows the coplanar line of the circuit shown in FIG. 1.
Figure 4:
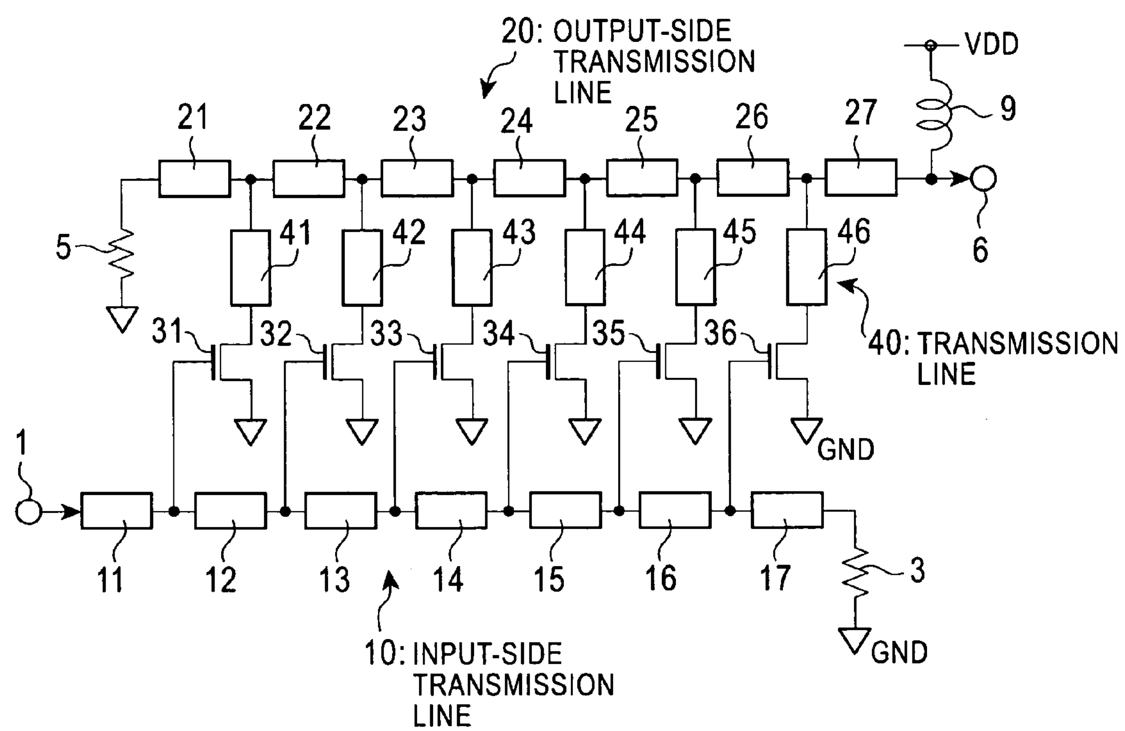
FIG. 4 is a constitutional view of the distributed amplifier illustrating the embodiment of the present invention.
Figure 5:
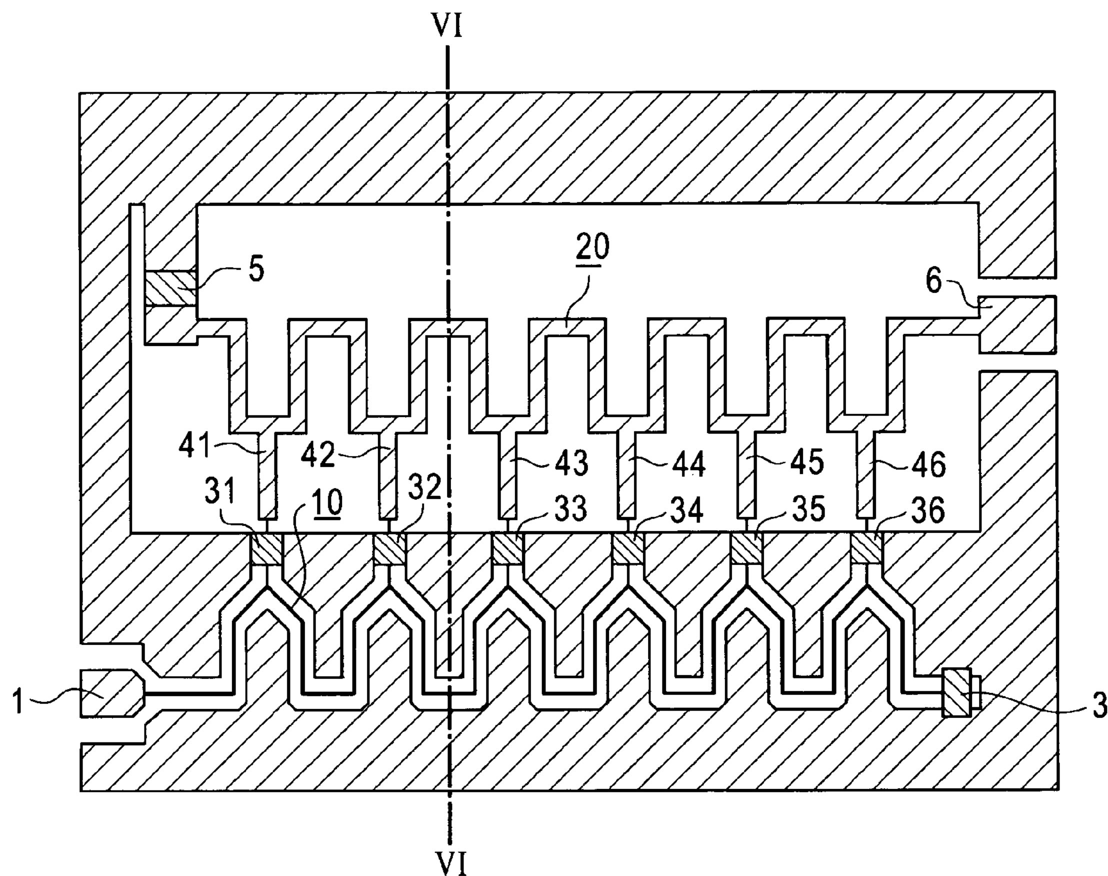
FIG. 5 shows the structure of the distributed amplifier in FIG. 4.
Figure 6:
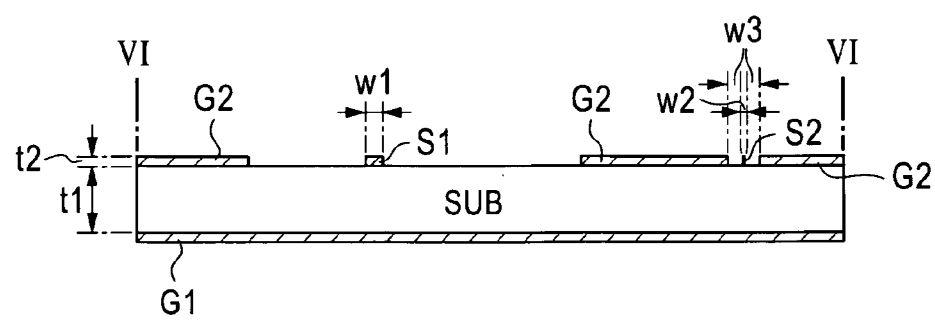
FIG. 6 is a partial cross-sectional view along the line VI-VI in FIG. 5.

FIG. 4 is a constitutional view of the distributed amplifier illustrating the embodiment of the present invention. FIGS. 5 and 6 show the structure of the distributed amplifier in FIG. 4, where FIG. 5 is a planar view thereof and FIG. 6 is a partial cross-sectional view thereof along the line VI-VI in FIG. 5.

As the circuit constitution in FIG. 4 shows, the distributed amplifier comprises an input-side transmission line 10 that is connected to an input terminal 1 to which broad-range input signals are supplied and that constitutes an input-side filter. As shown in FIG. 6, the input-side transmission line 10 is a coplanar line that is constituted by the signal line S2 and ground faces G2 that are formed on the surface of the dielectric substrate SUB. In addition, the ground face G1 is provided over the whole of the rear face of the dielectric substrate SUB.

The input-side transmission line 10 serially connects seven line elements 11, 12, . . . , 17 such that the leading terminal of the line element 11 is connected to the input terminal 1 and the end terminal of the line element 17 is connected to the ground potential GND via the terminator 3.

Further, the distributed amplifier comprises an output-side transmission line 20 constituting an output-side filter that corresponds with an input-side transmission line 10. As shown in FIG. 6, the output-side transmission line 20 is a microstrip line that is constituted by a signal line S1, which is formed on the upper surface of the dielectric substrate SUB, and the ground face G1 that is provided over the whole of the rear face of the dielectric substrate SUB.

The output-side transmission line 20 serially connects seven line elements 21, 22, . . . , 27 such that the leading terminal of the line element 21 is connected to the ground potential GND via the terminator 5 and the end terminal of the line element 27 is connected to the output terminal 6.

A plurality of transistors 31, 32, . . . , 36 constituting amplification units are connected in the form of a distribution circuit via a transmission line 40 that is constituted by a microstrip line between the input-side transmission line 10 and the output-side transmission line 20. That is, the gate electrode of the transistor 31 is connected to the connection point between the line elements 11 and 12 and the drain electrode of the transistor 31 is connected to the connection point between the line elements 21 and 22 via a line element 41 of the transmission line 40. Likewise thereafter, the gate electrode of the transistor 36 is connected to the connection point between the final line elements 16 and 17 and the drain electrode of the transistor 36 is connected to the connection point between the line elements 26 and 27 via the line element 46. The source electrodes of the transistors 31 to 36 are each connected to the ground potential GND. Further, the output terminal 6 has the supply voltage VDD supplied thereto via the inductor 9.

Here, a GaAs substrate for which the thickness t1 is 220 μm, for example, is used as the dielectric substrate SUB and the signal lines S1 and S2 are formed from metal for which the thickness t2 is 3 μm, for example. Further, the width w2 of the signal line S2 of the coplanar line, which is the input-side transmission line 10, is 5 μm, and the interval w3 between the signal line S2 and ground faces G2 is set at 27.5 μm. Further, the width w1 of the signal line S1 of the microstrip line, which is the output-side transmission line 20 and the amplification-unit transmission line 40 is then 40 μm.

As a result, the characteristic impedance Z0 of the input-side transmission line 10, output-side transmission line 20, and transmission line 40 is then 82Ω and the permissible current of the output-side transmission line 20 and transmission line 40 is then 400 mA or more. Further, the transistors 31 to 36 and the terminators 3 and 5 are formed on the surface of the dielectric substrate SUB in the same manner as the signal lines S1 and S2. Therefore, the respective source electrodes of the transistors 31 to 36 and the ground side of the terminators 3 and 5 are connected to the ground faces G2 that are formed on the surface of the dielectric substrate SUB.

In the case of this distributed amplifier, the supply voltage VDD is supplied to the output terminal 6 via the inductor 9 and to the drain electrode of each of the transistors 41 to 46 respectively via the output-side transmission line 20 and transmission line 40. An input signal on which a suitable bias voltage is superposed is also supplied from the input terminal 1.

The input signal is amplified as a result of being supplied to the gate electrode of each of the transistors 31 to 36 respectively via the input-side transmission line 10 constituting the input-side filter. The signals outputted from each of the transistors 31 to 36 are transmitted to the output-side transmission line 20 constituting the output-side filter via the transmission line 40. These signals are then synthesized by means of the output-side transmission line 20 and outputted from the output terminal 6 as an output signal.

Thus, with the distributed amplifier of this embodiment, a DC current barely flows and the input-side transmission line 10, for which a broad signal line with a large current capacitance is not necessary, is constituted by a coplanar line. As a result, the pattern area of the input-side transmission line 10 barely increases even when a coplanar line is used. In addition, by employing a coplanar line, the ground faces G2 can be provided on the surface of the dielectric substrate SUB. Therefore, the source electrodes of the transistors 31 to 36 can be connected directly to the ground faces G2 without the interposition of viaholes. There is therefore the advantage that the structure is simple and the circuit miniaturization is possible.

Further, the output-side transmission line 20, which requires a large DC current to flow, is constituted by a microstrip line. As a result, the long-term reliability of the metal forming the signal line can be assured and the output impedance can be set to a predetermined 50 ohms over a wide range without enlarging the circuit pattern.

In addition, circuit elements such as the signal lines S1 and S2, the terminators 3 and 5, and the transistors 31 to 36 are all formed on the surface of the dielectric substrate SUB and the rear face of the dielectric substrate SUB is the ground face G1, whereby the fabrication process can be simplified.

Further, the present invention is not limited to the embodiment above. Rather, a variety of modifications is possible. Such modified examples include the following, for example:

(a) The number of stages of the distributed amplifier is not limited to six: any number of stages is satisfactory;

(b) the widths w1 and w2 of the signal lines S1 and S2 respectively, the interval w3 between the signal line S2 and ground face G2, thicknesses t1 and t2 of the dielectric substrate SUB and signal line respectively and the value of the characteristic impedance Z0 are not limited to those illustrated;

(c) in the case of the input-side transmission line 10, which is a coplanar line, the ground face G1 is also formed on the rear-face side of the dielectric substrate SUB but the ground face G1 on the rear-face side of the input-side transmission line 10 may be dispensed with;

(d) as the transistors 31 to 36, bipolar transistors can be used in addition to field effect transistors such as source/ground-type field effect transistors, cascode-connected field effect transistors, and dual-gate field effect transistors; and (e) the dielectric substrate SUB is not limited to GaAs and may instead be silicon or the like.

This application is based on Japanese Patent Application No. 2004-188144 which is herein incorporated by reference.

What is claimed is:

1. A distributed amplifier, wherein a coplanar line and a microstrip line are used as transmission lines; and a signal line and a ground face of the coplanar line, a signal line of the microstrip line, and a plurality of amplification transistors are formed on the upper face of a dielectric substrate, and the ground face of the microstrip line is formed on the lower face of the dielectric substrate.

2. A distributed amplifier constituted such that a plurality of amplification transistors are distribution-connected between an input-side transmission line and an output-side transmission line, wherein the input-side transmission line is constituted by a coplanar line having a signal line and a ground face formed on the upper face of a dielectric substrate;

the output-side transmission line is constituted by a microstrip line having a signal line formed on the upper face of the dielectric substrate and a ground face formed on the lower face of the dielectric substrate; and the plurality of amplification transistors are formed on the upper face of the dielectric substrate and electrodes of the amplification transistors are connected to the signal line or the ground face formed on the upper face of the dielectric substrate.

3. The distributed amplifier according to claim 2, wherein a the ground face of the microstrip line is formed over the whole of the lower face of the dielectric substrate.

4. A distributed amplifier, comprising a dielectric substrate having an upper face and a lower face;

a plurality of amplification transistors;

a coplanar line including a first signal line and a first ground face; and a microstrip line including a second signal line and a second ground face, the coplanar line and microstrip line functioning as transmission lines;

wherein the first and second coplanar lines, the first ground face and the plurality of amplification transistors are formed on the upper face of the dielectric substrate, and the second ground face is formed on the lower face of the dielectric substrate.

* * * * *